(12) United States Patent
Omata

(10) Patent No.: US 7,066,626 B2
(45) Date of Patent: Jun. 27, 2006

(54) LED LAMP

(75) Inventor: Kazuki Omata, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 125 days.

(21) Appl. No.: 10/820,109

(22) Filed: Apr. 8, 2004

(65) Prior Publication Data
US 2004/0201987 A1    Oct. 14, 2004

(30) Foreign Application Priority Data

Apr. 9, 2003  (JP) .............................. 2003-104828
Nov. 20, 2003 (JP) .............................. 2003-390786

(51) Int. Cl.
F21S 6/00    (2006.01)
(52) U.S. Cl. ...................... 362/257; 362/227; 362/317
(58) Field of Classification Search ................ 362/227, 362/235, 249, 252, 257, 260, 307, 308, 310, 362/317, 326, 328–9, 347, 350
See application file for complete search history.

(56) References Cited

U.S. PATENT DOCUMENTS 5,564,819 A * 10/1996 Yamaguchi ................. 362/241
5,947,588 A *  9/1999 Huang ........................ 362/235
2004/0190304 A1 * 9/2004 Sugimoto et al. ........... 362/555

FOREIGN PATENT DOCUMENTS

JP    2002-076443    3/2002
TW       499745     8/2002

OTHER PUBLICATIONS

CL-460S, 470S series, data sheet, [online], Citizen Electronics Co., Ltd, (Feb. 20, 2003 ) Retrieved from Internet <URL: http:/www.c-e.co.jp/products/index1.html>.

* cited by examiner

Primary Examiner—Renee Luebke
Assistant Examiner—Julie A. Shallenberger
(74) Attorney, Agent, or Firm—Browdy and Neimark, P.L.L.C.

(57) ABSTRACT

An LED lamp including a circuit substrate (22) on which an electrode pattern is formed, a reflecting frame (31) including a tapered concave portion (32) having an inner peripheral surface broadening toward an upper end of the reflecting frame, a light emitting unit (27) disposed on a central portion of the concave portion (32), an air layer (40) disposed above the light emitting unit (27), and a lens body (44) provided through the air layer above the reflecting frame (31), the reflecting frame being provided with an air hole (45) for communicating the air layer with an outside area of the LED lamp.

12 Claims, 15 Drawing Sheets

ID LAMP

BACKGROUND OF THE INVENTION

1. Field of the Invention

The present invention relates to an LED lamp mounted on a mobile phone having a function for a camera, a mobile information terminal device or the like, and used as a flash light source.

2. Description of Related Art

Generally, a flash light source has been mounted on a camera, and a xenon tube has been used for a great number of flash light sources. The xenon tube has been unsuitable for an instrument such as a mobile phone whose miniaturization and low power consumption are requested, because the xenon tube has strong light, and high power consumption.

Therefore, a small surface-mountable LED lamp in which a plurality of light emitting elements are arranged on a chip substrate is used practically as shown in CL-460S, 470S series, data sheet, [on line], Citizen Electronics Co., Ltd, Feb. 20, 2003 searching, Internet URL<http:/www.c-e.co.jp/products/index1.html>.

By using the LED lamp having such a structure, a predetermined amount of light is acquired and low power consumption can be realized.

However, because the LED lamp has no directivity, it is unsuitable for the purpose of acquiring strong and high amount of light in a predetermined direction such as a photo-flash of the camera.

SUMMARY OF THE INVENTION

It is, therefore, an object of the present invention to provide an LED lamp mountable as a flash light source of a camera provided in a small mobile phone by having directivity of light in a predetermined direction and by intention of an increased brightness of light due to the reflection.

To attain the above object, an LED lamp according to a first aspect of the present invention comprises a circuit substrate provided with an electrode pattern, a light emitting unit mounted on the circuit substrate, and a reflecting frame mounted on the circuit substrate and including a concave portion disposed to surround the light emitting unit.

A reflecting surface for reflecting light emitted from the light emitting unit is formed on an inner peripheral surface of the concave portion. The reflecting surface includes a taper shape configured to broaden toward an upper end of the reflecting frame.

An LED lamp according to a second aspect of the present invention comprises a circuit substrate provided with an electrode pattern, a light emitting unit mounted on the circuit substrate, a reflecting frame mounted on the circuit substrate and including a concave portion disposed to surround the light emitting unit, a lens body disposed above the light emitting unit and attached to the reflecting frame to form an air layer between the light emitting unit and the lens body, and an air hole provided in at least one of the circuit substrate, the reflecting frame and the lens body for communicating the air layer with an outside area of the lamp.

A reflecting surface for reflecting light emitted from the light emitting unit is formed on an inner peripheral surface of the concave portion. The reflecting surface includes a taper shape configured to broaden toward an upper end of the reflecting frame.

DETAILED DESCRIPTION OF THE PREFERRED EMBODIMENTS

Hereinafter, several embodiments of an LED (light emitting diode) lamp according to the present invention will be explained in detail with reference to the accompanying drawings.

FIGS. 1 to 4 illustrate a first embodiment of the LED lamp 21 according to the present invention.

The LED lamp 21 comprises a circuit substrate 22, a light emitting unit 27 mounted on the circuit substrate 22 and a reflecting frame 31 mounted on the circuit substrate 22 to surround the light emitting unit 27.

Figure 3:
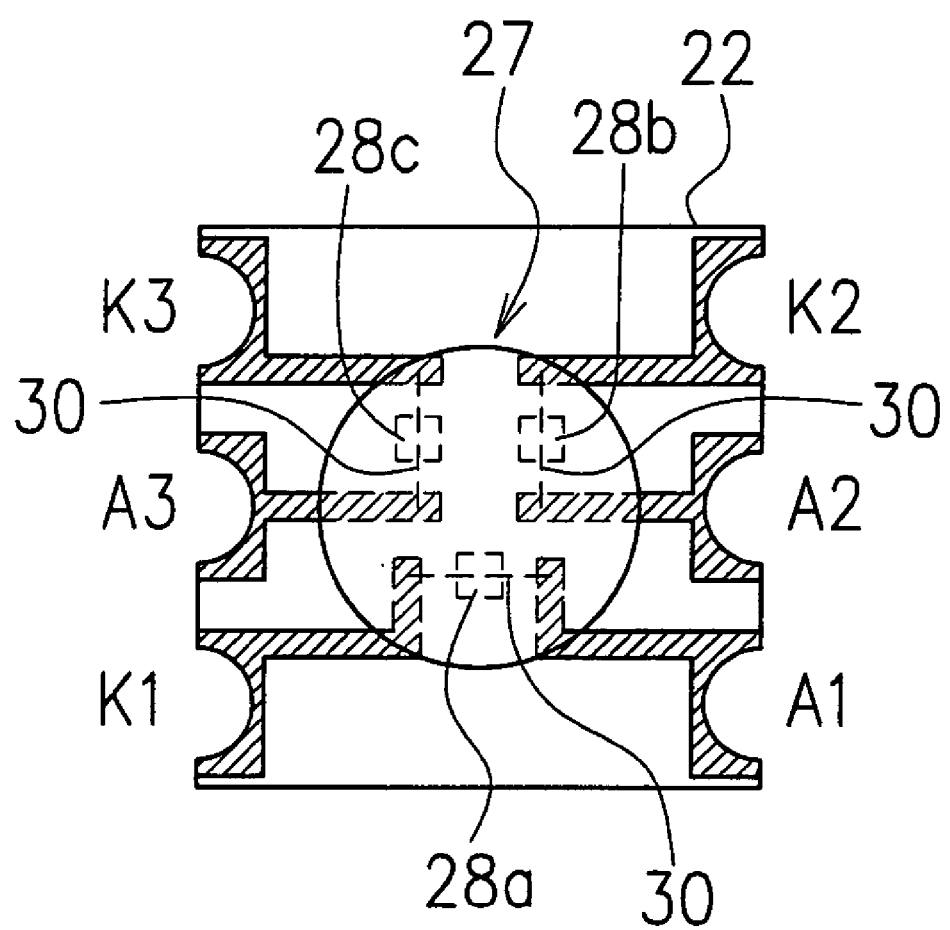
FIG. 3 is a top plan view of the LED lamp in the first embodiment.

The circuit substrate 22 is formed with three pairs of anode and cathode electrodes, for example. More specifically, the circuit substrate 22 has a generally rectangular shape made of glass epoxy or BT resin or the like, and the anode and cathode electrodes A1, A2, A3, and K1, K2, K3 are formed on both side surfaces of the circuit substrate by through holes, as shown in FIG. 3. In addition, three light emitting diode elements which will be explained hereinafter, or LED elements 28a, 28b and 28c are mounted between leading ends of each of a pair of anode and cathode electrodes A1 and K1, a pair of anode and cathode electrodes A2 and K2, and a pair of anode and cathode electrodes A3 and K3, respectively, in a lead pattern which extends from the both side surfaces to a central portion of the circuit substrate. The light emitting diode elements and the three pairs of electrodes are connected through bonding wires 30, respectively.

The light emitting unit 27 comprises the three LED elements 28a, 28b and 28c as described above and a transparent or translucent resin material 29 to seal the LED elements. The LED elements 28a, 28b and 28c are composed of semi-conductors of gallium nitride system compound, and connected between the anode and cathode electrodes A1, A2, A3 and K1, K2, K3, respectively, and spaced out evenly into a triangle shape on a central portion of the circuit substrate 22, as shown in FIG. 3.

The reflecting frame 31 is composed of a member having approximately the same planar shape as the circuit substrate 22 and is fixed on the circuit substrate 22 by any means. The reflecting frame 31 has also a thickness larger than that of the circuit substrate 22 and surrounds at a central portion thereof the light emitting unit 27 and has a circular inner peripheral surface and is provided with an inverted frustum shaped concave portion 32 having a taper enlarging outwardly as going upwardly. The inner peripheral surface of the concave portion 32 is formed with a reflecting surface 33 for collecting light emitted from the light emitting unit 27 in a desired direction equally. The reflecting surface 33 is composed of nickel plating or the other plating of silver system, for example. Consequently, it is possible to reflect effectively upwardly light emitted from the light emitting unit 27 by the reflecting surface 33. A shape of and an inclined angle of the taper of the reflecting surface 33 are set suitably pursuant to a specification of the LED lamp 21, while it is preferable that the shape has a circle centering on the light emitting unit 27 and the inclined angle has a scope of 40 to 80 degrees toward an upper direction, in order to radiate uniformly light in a constant distance as a flash light source of a camera.

Figure 4:
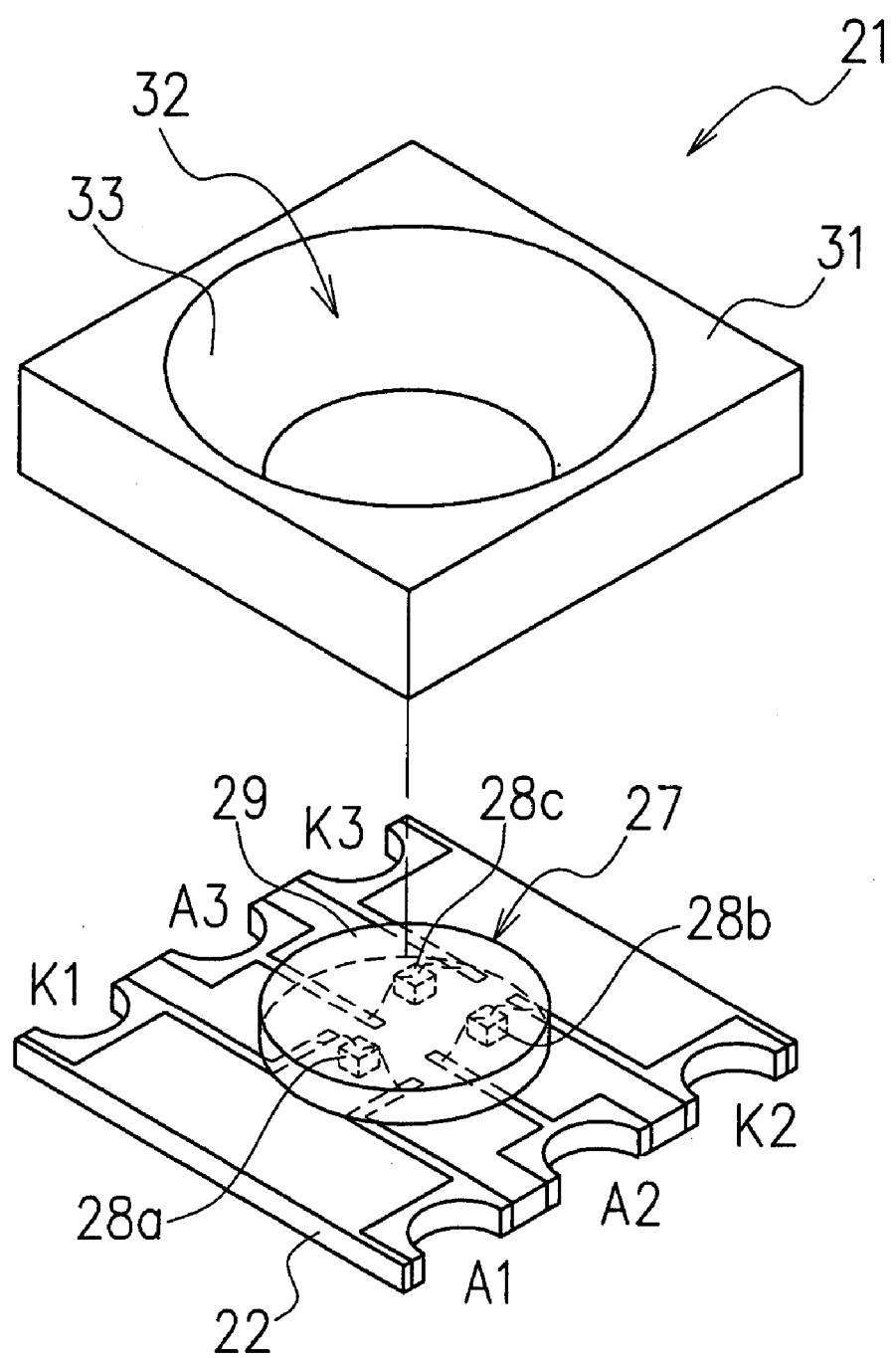
FIG. 4 is an assembled perspective view of the LED lamp in the first embodiment.

The LED lamp 21 in the embodiment is formed by mounting the LED elements 28a to 28c on the circuit substrate 22 on which the anode and cathode electrodes A1, A2, A3 and K1, K2, K3 are provided and after sealing by a resin material 29 to cover the LED elements, by installing the reflecting frame 31 on the circuit substrate 22, as shown in FIG. 4.

In the LED lamp 21 in the first embodiment having the above structure, a light emitting brightness in a front direction of the light emitting unit 27 can be very enhanced by light emitted upwardly directly from the light emitting unit 27 composed of the three LED elements 28a to 28c and light reflected on the reflecting surface 33.

Figure 1:
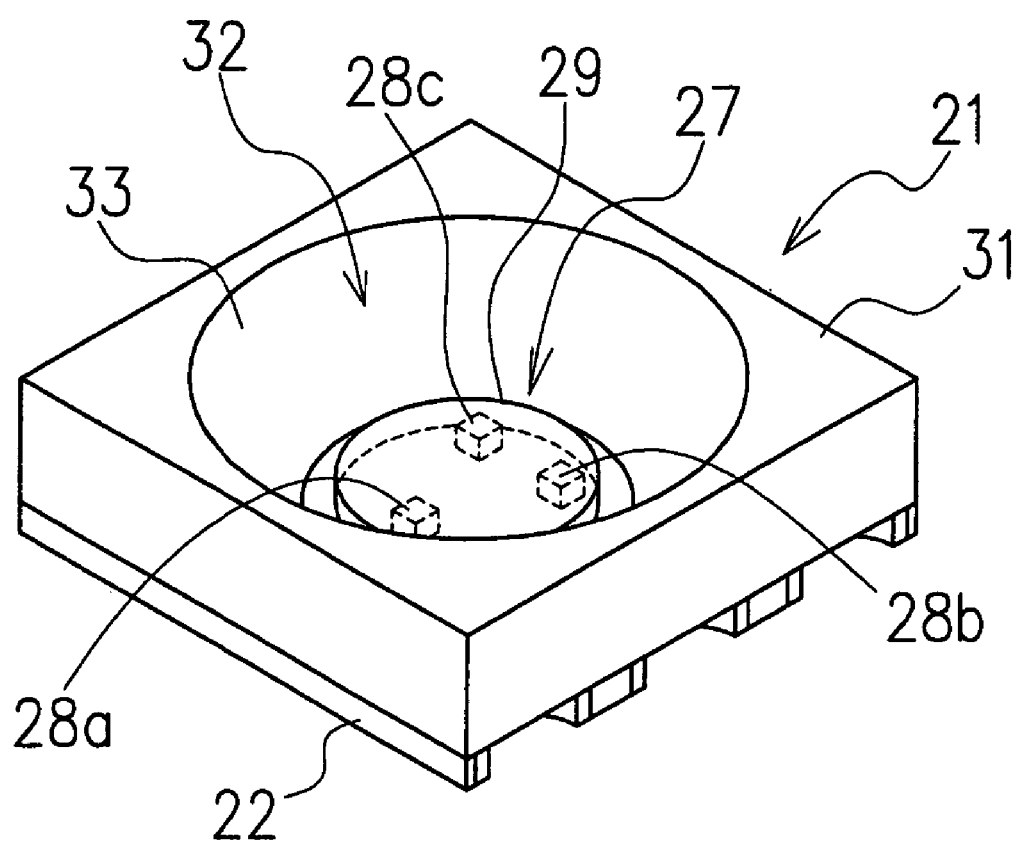
FIG. 1 is a perspective view showing a first embodiment of an LED lamp according to the present invention.
Figure 2:
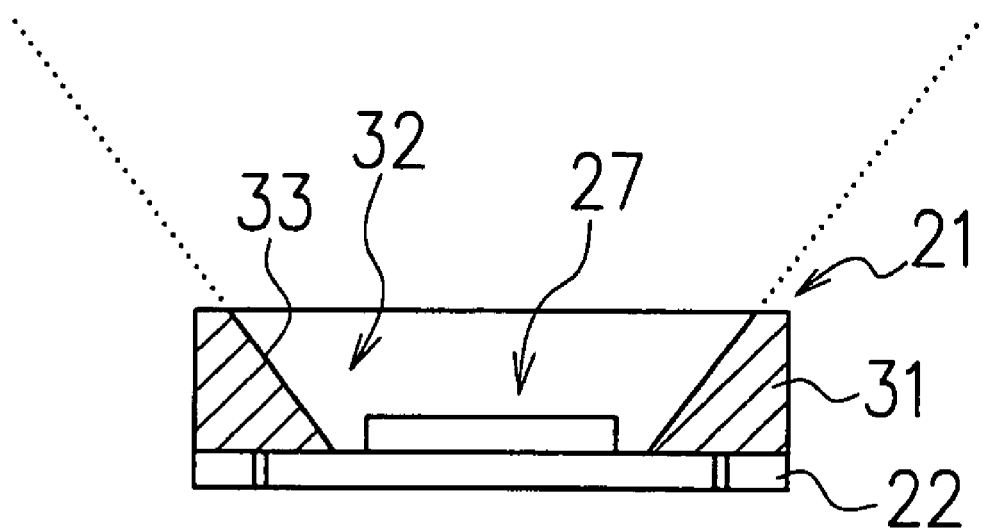
FIG. 2 is a sectional view of the LED lamp in the first embodiment.

Moreover, as shown in FIG. 2, it is possible to radiate light in a certain direction by collection of light emitted from the light emitting unit 27 in the front direction of the light emitting unit by means of the reflecting surface 33 and to install the reflecting frame 31 on the circuit substrate in a narrow mounted space because the reflecting frame 31 is formed into approximately the same planar size as that of the circuit substrate 22 and in a planar shape without any projections. As a result, it is also possible to install easily the reflecting frame 31 in a mobile phone in which a camera function is built and to acquire a sufficient amount of light as the flash light source. Because the LED elements constituting the light emitting unit 27 have the three pairs of electrodes in which each pair is independent on the other pairs, it is possible to carry out any control of light emit of illumination only by one LED element 28a, illumination by the two LED elements 28a and 28b, and illumination by simultaneous emit of light of the three LED elements 28a, 28b and 28c. Meanwhile, in the embodiment, although the light emitting unit 27 is composed of the three LED elements 28a, 28b and 28c, the light emitting unit is not limited to the configuration of the three LED elements as in the embodiment, a configuration of one or more than four LED elements may be used in accordance with the intended use.

Figure 5:
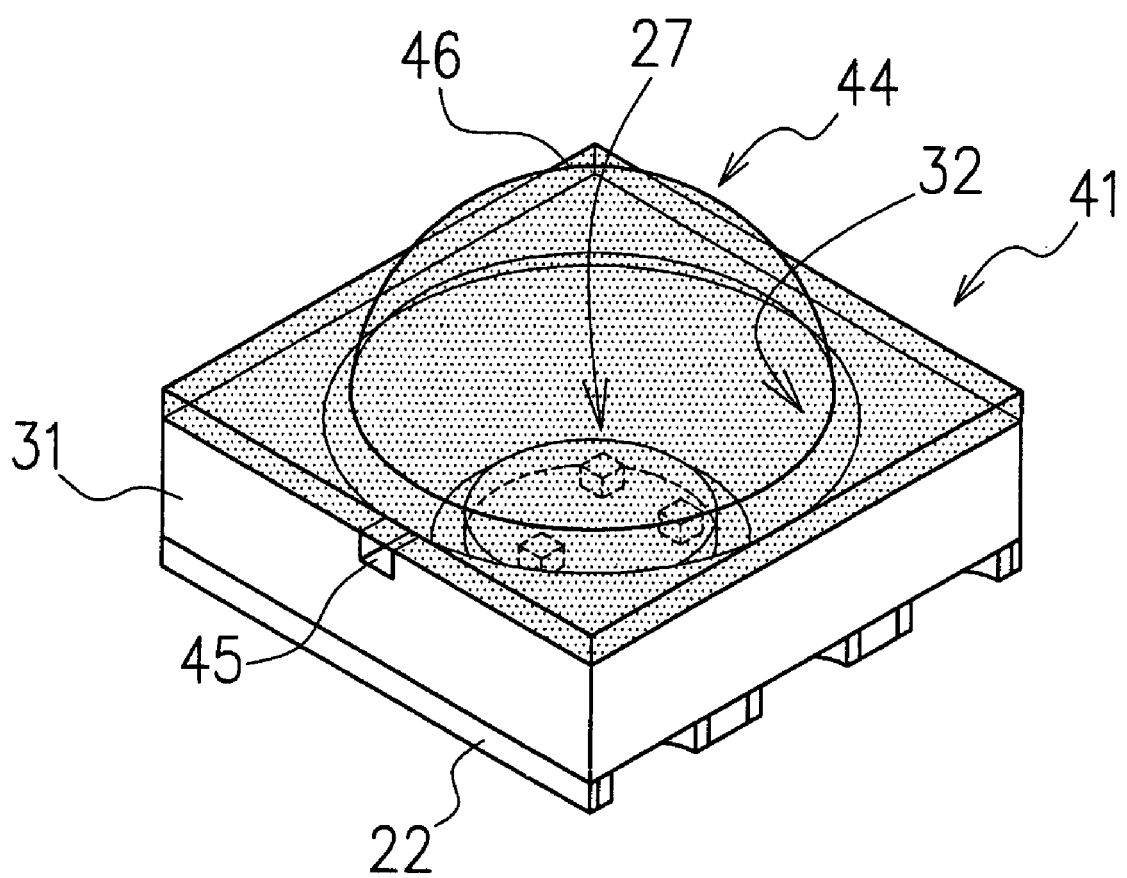
FIG. 5 is a perspective view showing a second embodiment of the LED lamp according to the present invention.
Figure 6:
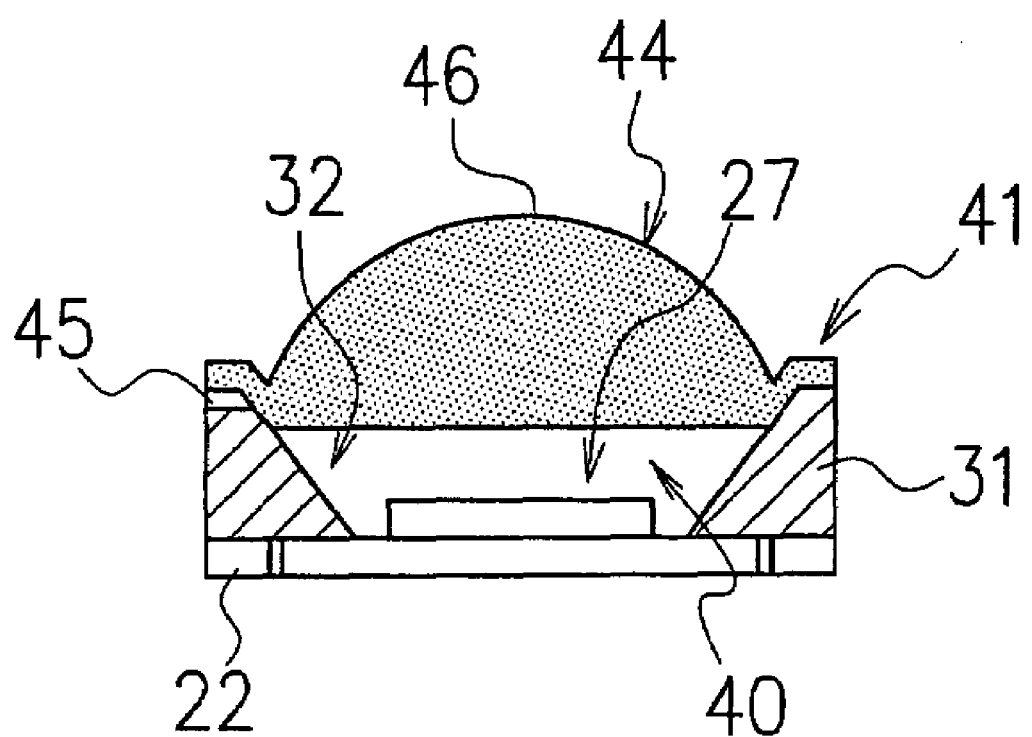
FIG. 6 is a sectional view of the LED lamp in the second embodiment.

FIGS. 5 and 6 illustrate a second embodiment of the LED lamp according to the present invention.

In FIGS. 5 and 6, the same reference numerals are attached to the same parts as these in the first embodiment shown in FIGS. 1 to 4.

A LED lamp 41 in the embodiment is composed of the circuit substrate 22 provided with an electrode pattern, the light emitting unit 27 mounted on the circuit substrate 22, the reflecting frame 31 having the reflecting surface 33 in the concave portion 32, surrounding the light emitting unit 27, an air layer 40 surrounded by the reflecting frame 31 and positioned above the light emitting unit 27, and a lens body 44 provided on the reflecting frame 31 so that the air layer 40 is disposed between the lens body 44 and the light emitting unit 27. The lens body 44 includes a convex surface 46 provided at an upper surface thereof. Although a light collecting operation by the light emitting unit 27 and the reflecting frame 31 is the same as in the LED lamp 21 in the first embodiment as described above, by providing the lens body 44 on the reflecting frame 31, it is possible to intend a more increased amount of emitted light than the LED lamp 21 in the aforementioned first embodiment, because light radiated upwardly by the light emitting unit 27 and the reflecting surface 33 is collected by the convex surface 46 of the lens body 44. An under portion of the lens body 44, in other words, the air layer 40 is disposed between the lens body 44 and the light emitting unit 27 and therefore light emitted from the light emitting unit 27 is radiated outwardly by passing through mediums having two different refractive indexes of the air layer 40 and the lens body 44. In the LED lamp, the light collecting can be further enhanced by the different refractive indexes. The lens body 44 is formed of a transparent or translucent resin or by processing directly a glass material into a predetermined shape. In addition, the concave portion 32 is closed by providing the lens body 44 on the reflecting frame 31 in the LED lamp 41 in the embodiment. Consequently, there is a fear that the air layer 40 in the concave portion 32 is inflated when mounting the LED lamp on the circuit substrate by means of a reflow processing. In order to improve this problem, an air hole 45 for communicating the air layer 40 with an outside area of the LED lamp is provided to lower a barometric pressure in the air layer 40. Therefore, the reflow processing can be carried out safely and firmly and the deterioration of quality of the LED lamp can be prevented.

Figure 7:
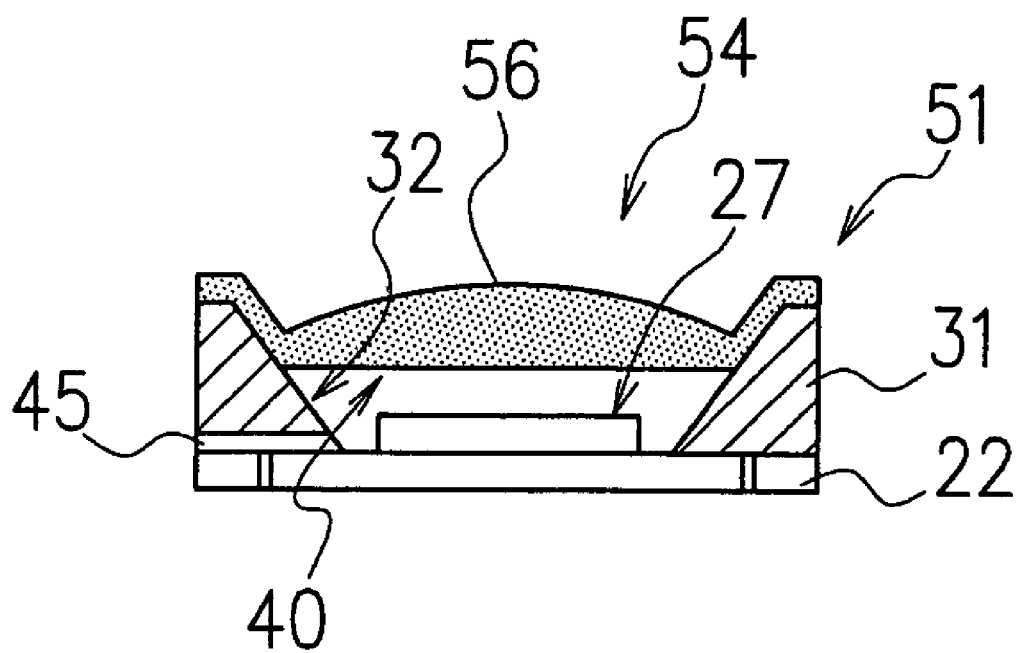
FIG. 7 is a sectional view showing a third embodiment of the LED lamp according to the present invention.

FIG. 7 illustrates a third embodiment of the LED lamp 51 according to the present invention. In FIG. 7, the same reference numerals are attached to the same parts as these in the first and second embodiments. In the third embodiment, a central portion, namely, a convex surface 56 of a lens body 54 is lowered than an upper surface of the reflecting frame 31 to position in the concave portion 32. Because the upper surface of the reflecting frame 31 becomes planar by the convex surface 56 being disposed in the concave portion 32, a thinned LED lamp can be acquired. In particular, if the apex of the convex surface 56 is set to be the same level as the upper surface of the reflecting frame 31, a thickness of the LED lamp 51 can be set to approximately be the same as that of the LED lamp 21 in the first embodiment as described above. According to the LED lamp 51 in the third embodiment, because directivity of the emitted light and the amount thereof are the same as that of the LED lamp 41 shown in FIG. 6, while, the lens body 54 is not projected from the upper surface of the reflecting frame 31, it is optimum to install it in a thinned instrument such as a mobile phone.

Figure 8:
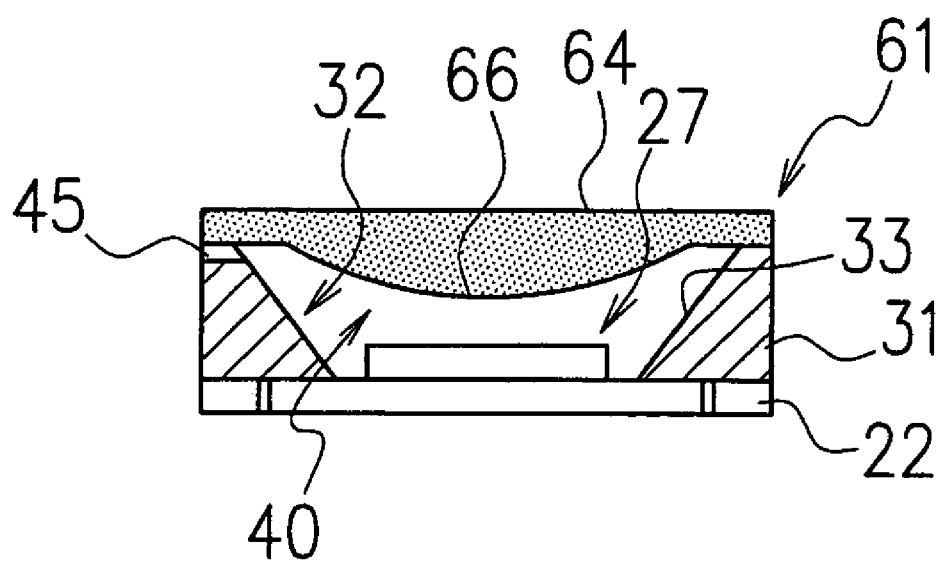
FIG. 8 is a sectional view showing a fourth embodiment of the LED lamp according to the present invention.

FIG. 8 illustrates a fourth embodiment of the LED lamp according to the present invention. The same reference numerals are attached to the same parts as these in the first to third embodiments.

The LED lamp 61 in the embodiment includes a lens body 64 having a convex surface 66, which is disposed to face the light emitting unit 27. Because the light collecting of the LED lamp 61 is the same as the LED lamps 41 and 51 in the second and third embodiments, while the upper surface of the reflecting frame 31 becomes planar, it is possible to thin a thickness of the LED lamp 61 similarly as in the third embodiment.

Figure 9:
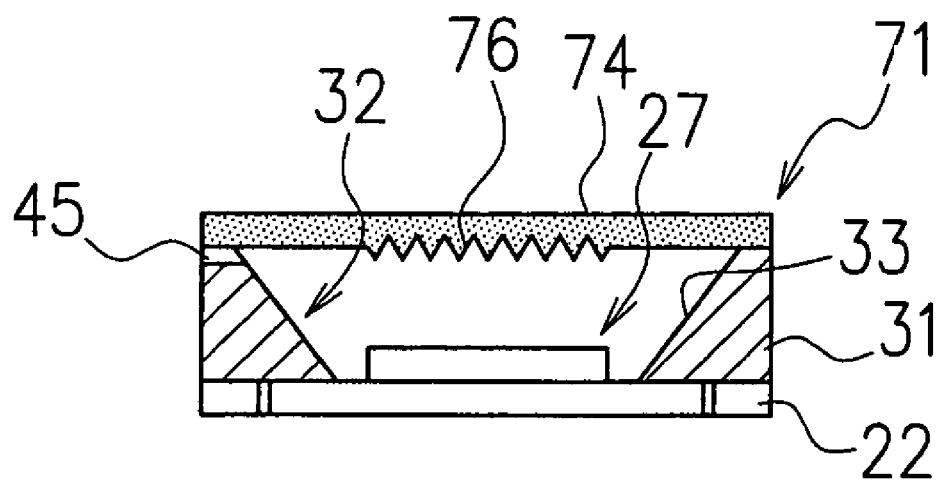
FIG. 9 is a sectional view showing a fifth embodiment of the LED lamp according to the present invention.

FIG. 9 illustrates a fifth embodiment of the LED lamp according to the present invention. The same reference numerals are attached to the same parts as these in the first to four embodiments.

The LED lamp 71 in the embodiment is configured to have a light scattering effect by forming one portion of a planar plate-shaped lens body 74 covering above of the concave portion 32 formed in the reflecting frame 31 into a rough surface 76. The rough surface 76 is prepared by processing a surface of the lens body 74 facing the light emitting unit 27 into concave-convex portions. By providing such a rough surface, it is possible to scatter adequately upwardly the emitted light from the light emitting unit 27 and the reflected light on the reflecting surface 33.

Figure 10:
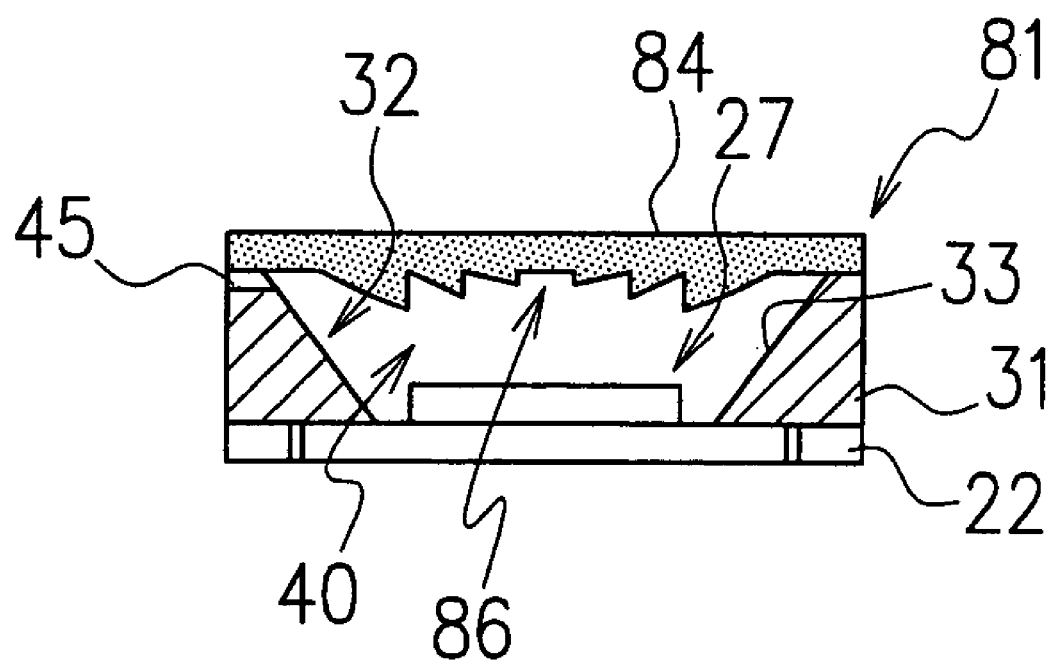
FIG. 10 is a sectional view showing a sixth embodiment of the LED lamp according to the present invention.

FIG. 10 illustrates a sixth embodiment of the LED lamp according to the present invention. The same reference numerals are attached to the same parts as these in the first to fifth embodiments.

The LED lamp 81 in the embodiment includes a fresnel lens surface 86 formed on one surface or an inner surface of a lens body 84 similar to the lens body 64 in FIG. 8. The fresnel lens surface 86 has an advantageous effect that a thickness of the lens body itself can be thinned with light collecting effect due to the same light refraction as a convex lens optically.

Each of the lens bodies 44, 54, 64, 74 and 84 is formed at one surface with the convex surface 46, 56, or 66, the rough surface 76 or fresnel lens surface 86 and at the other surface with a planar surface. Each lens body is mounted on the reflecting frame 31 in such a manner that the convex surface, the rough surface or fresnel lens surface is directed to the light emitting unit 27 and the planar surface is exposed to the outside area of the LED lamp. As a result, a high light collecting due to the convex surface or the fresnel lens surface and the light scattering effect due to the rough surface are obtained and the LED lamp can be thinned because an outer surface of the lens body is planar.

Meanwhile, if the fact of thinning the LED lamp is neglected, it is possible to obtain a more high light collecting effect by forming both surfaces of the lens body into convex surfaces or fresnel lens surfaces.

In the LED lamps shown in FIGS. 2 to 6, the inner portion of the reflecting frame 31 is in the air layer 40, but the optical effect due to the provision of the air layer 40 is to obtain a more large light collecting effect. If refracting index of light in the air layer 40 is one (1), it is known that refracting index of resin forming the lens body is 1.5 before and after. Therefore, during light emitted from the light emitting unit 27 passes through the air layer 40 and the lens body 44, 54, 64, 74 or 84, the refractive index of the light becomes large, and therefore a more large light collecting effect can be obtained. Correspondingly, if a resin forming the lens body is filled in a space between the lens body and light emitting unit without providing any gap or air layer to form the lens body, because the refractive index of light emitted from the light emitting unit depends on the refractive index of the resin only, it is not possible to expect a large light-condensing effect.

Figure 11A:
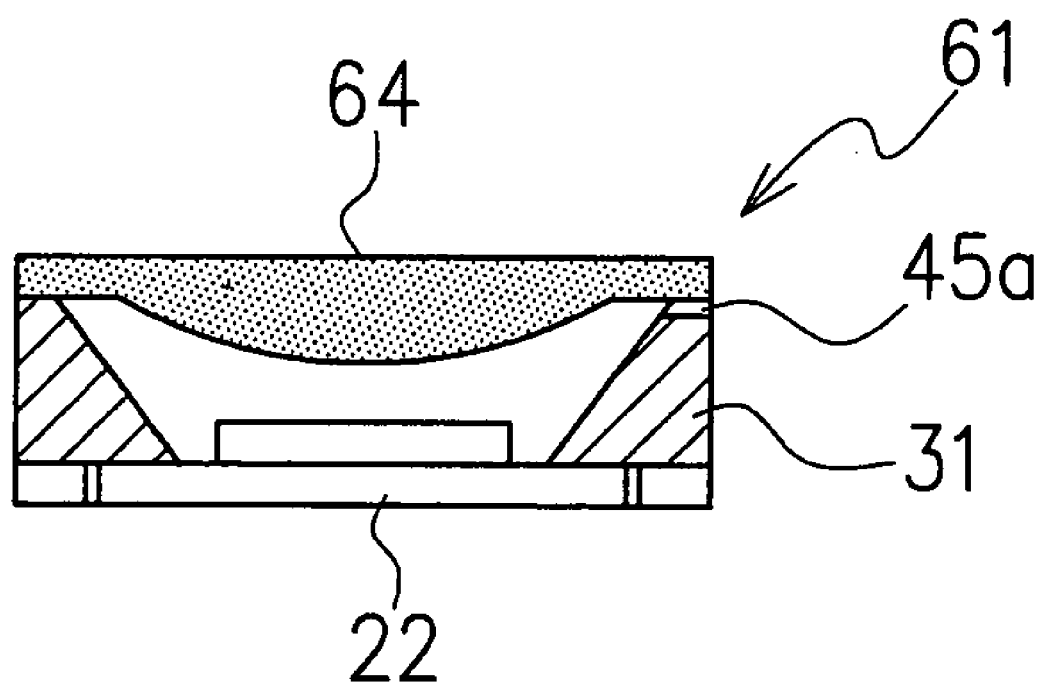
FIG. 11A is a sectional view showing a first example of provision of an air hole provided in the LED lamp for communicating with an outside area of the LED lamp.
Figure 11B:
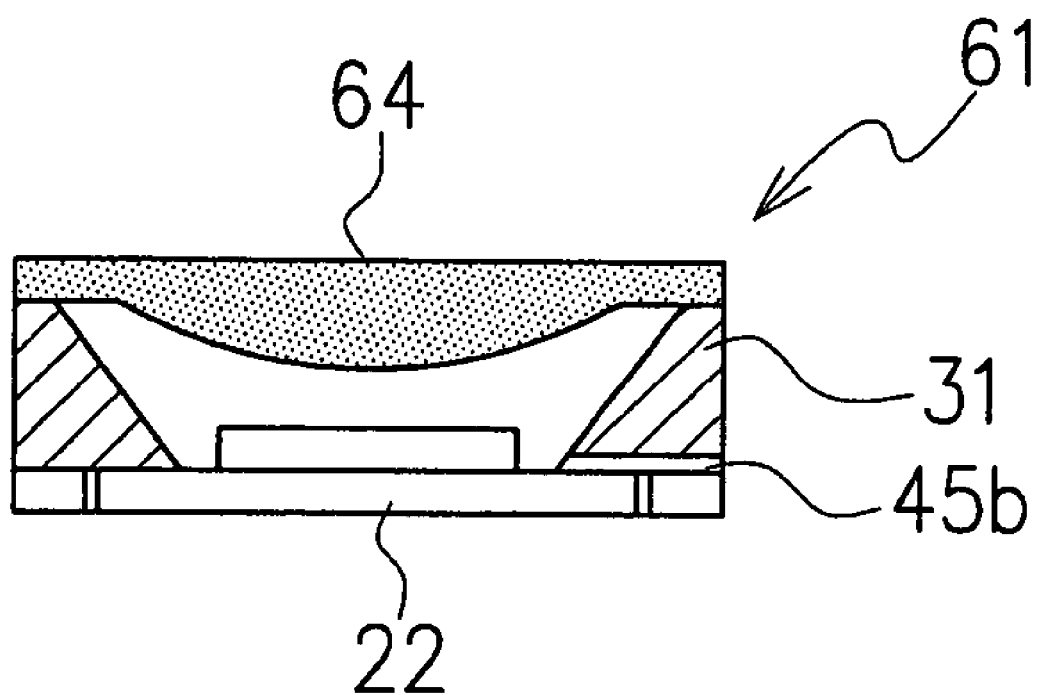
FIG. 11B is a sectional view showing a second example of the provision of the air hole
Figure 11C:
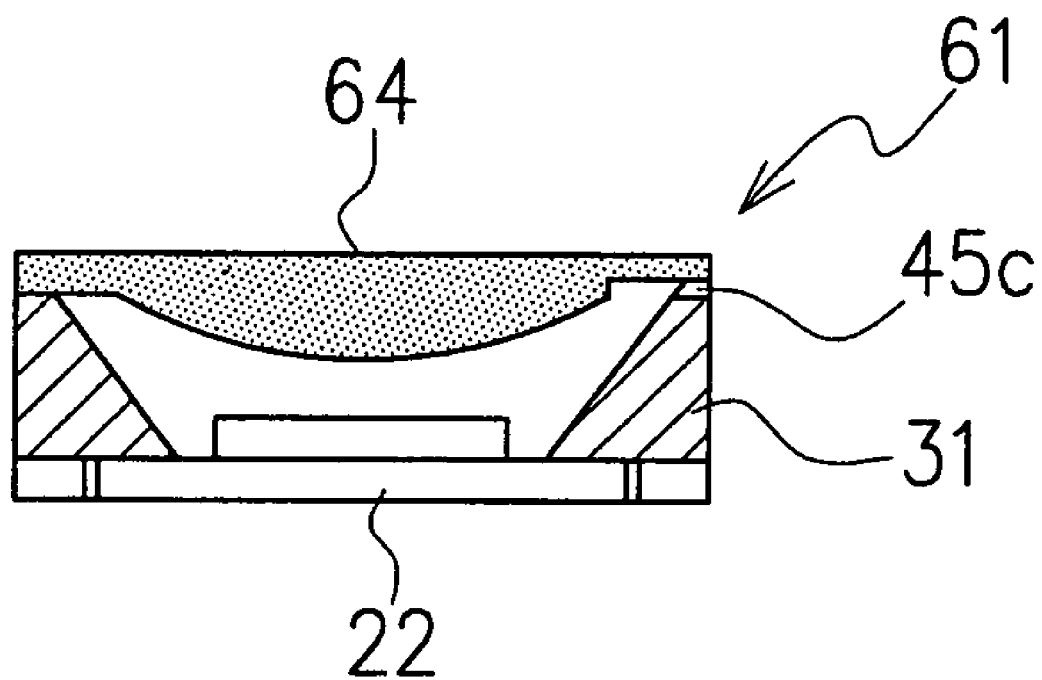
FIG. 11C is a sectional view showing a third example of the provision of the air hole
Figure 11D:
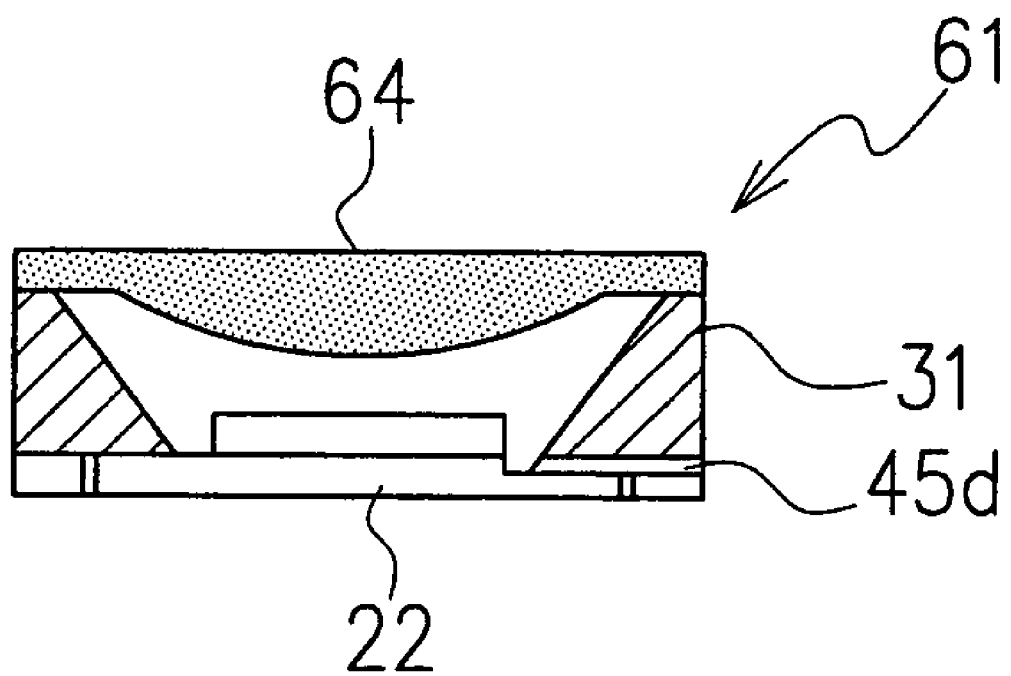
FIG. 11D is a sectional view showing a fourth example of the provision of the air hole

Although the LED lamp having the lens body in each of the embodiments as shown in FIGS. 2 to 6 is provided with the air hole 45, the air hole 45 may be provided on any position, at which the air layer 40 can be communicated with the outside area of the LED lamp. For example, in the LED lamp 61 in the fourth embodiment shown in FIG. 8, the air hole 45 may be provided in either an upper portion of the reflecting frame 31 contacting with the lens body 64 (FIG. 11A), a lower portion of the reflecting frame 31 contacting with the circuit substrate 22 (FIG. 11B), a portion of the lens body 64 (FIG. 11C) or a portion of the circuit substrate 22 (FIG. 11D), pursuant to a size and a shape of the LED lamp or a method for mounting thereof. In addition, it is sufficient to provide at least one air hole 45 in the one position as described above, but a plurality of air holes may be provided pursuant to a size of the LED lamp and a method for mounting thereof.

Figure 12:
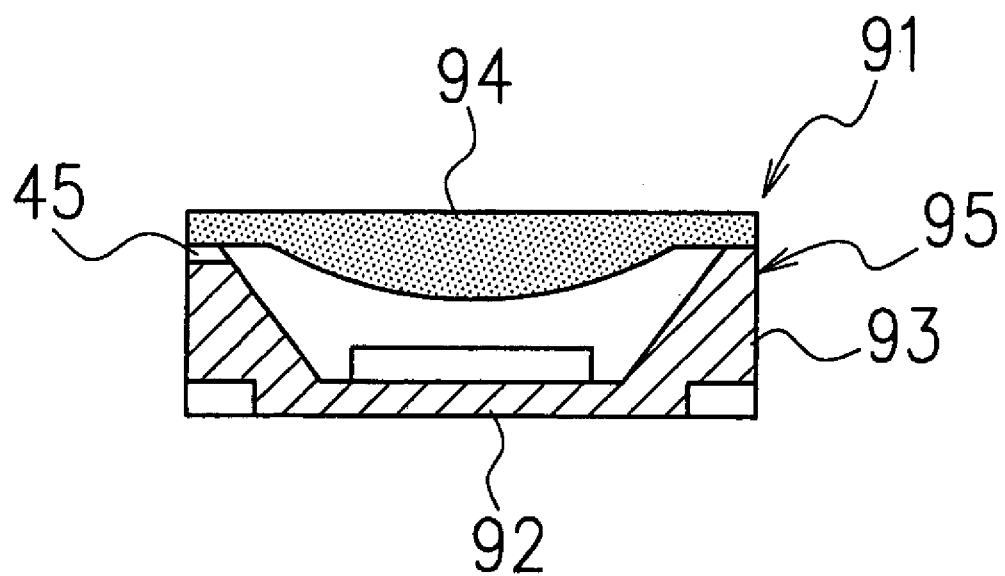
FIG. 12 is a sectional view showing an LED lamp in which a circuit substrate and a reflecting frame are integrally formed by an MID (Molded Interconnect Device).

In each of the embodiments as shown in FIGS. 1 to 6, base portions of the LED lamp are composed of the circuit substrate 22 on which the circuit pattern for mounting the light emitting unit 27 thereon is provided, and the reflecting frame 31 disposed on the circuit substrate 22, but a circuit substrate portion 92 and a reflecting frame portion 93 may be integrated with respect to each other to form a three-dimensional type base portion 95 as an LED lamp 91 shown in FIG. 12. The three-dimensional type base portion 95 can be formed easily and accurately into any shape by use of an MID (Molded Interconnect Device) and a good reflecting effect without diffused reflection can be obtained because the circuit substrate portion 92 and the reflecting frame portion 93 form a seamless continued surface.

Although the different lens bodies 44, 54, 64, 74 and 84 are mounted on the LED lamps 41, 51, 61, 71 and 81 as shown in the embodiments in FIGS. 2 to 5, a curvature radius and a refractive index of each lens body are not necessarily limited in a range in which light collection is obtained.

Meanwhile, there are the following two structures if the LED lamp in each of the aforementioned embodiments is lighted and used as a flash light source in a camera.

A first structure is to use the LED elements 28a, 28b and 28c of a blue light emitting type as the light emitting unit 27 and to mix a YAG fluorescent material into the sealing resin material 29, as shown in FIGS. 3 and 4. A second structure is to configure the light emitting unit 27 by use of LED elements of a light emitting type of red, green and blue colors and to form emission of light of white color by adjustment of color or brightness of each of the LED elements. The second structure makes it possible to prepare various light emitting colors other than the white color.

As described above, according to the present invention, it is possible to radiate light emitted from the light emitting unit with the directivity of a predetermined angle in a front direction of emitting light by the reflecting frame provided with the concave portion for collecting light. In particular, it is possible to have a broadening of light in the front direction of the light emitting unit and to acquire an advantageous effect of uniform illumination without uneven brightness, because the inner peripheral surface of the concave portion is formed into the upwardly extending taper shape. Therefore, the LED lamp is suitable for a flash light source of a camera requiring light of a large amount and a high brightness to a subject to be photographed.

Because the reflecting frame having the concave portion for collecting light is provided on the periphery of the light emitting unit mounted on the circuit substrate and the upper portion of the concave portion is covered by the lens body, light which is reflected on the inner peripheral surface of concave portion and configured to increase a radiated amount of light can be collected further in a predetermined direction by the lens body. Moreover, because the air layer is configured within the concave portion, which is covered by the lens body, a more high light collecting effect can be obtained by a difference between the light refractive indexes of the lens body and the air layer. Furthermore, it is possible to eliminate air inflation in the air layer at the time the LED lamp is placed under a high temperature such as a re-flow mounting processing by providing the air hole for communicating the air layer with the outside on at least one of the circuit substrate, reflecting frame and lens body. As a result, it is possible to carry out safely and firmly the reflow mounting processing and to avoid degradation of performance of the LED lamp.

Furthermore, light emitted from the light emitting unit and reflected on the reflecting frame can be projected far away, by forming at least one surface of the lens body having the light incident and exit planes into the convex lens surface. In addition, a fresnel lens surface may be used instead of the convex lens surface. By using such a fresnel lens surface, the whole of the LED lamp can be thinned with the same optical characteristic as that of the convex lens surface.

The convex lens surface or fresnel lens surface can be disposed in proximity to the light emitting unit by configuring one surface of the lens body into a convex lens surface or fresnel surface and another surface thereof into a planar surface and arranging the convex lens surface or fresnel lens surface to face the light emitting unit. Therefore direct light emitted from the light emitting unit and reflected light reflected on the inner surface of the reflecting frame can be collected efficiently.

Because the outer surface of the lens body is also planar, the whole of the LED lamp can be thinned, and therefore the thinned LED lamp can be mounted on the circuit substrate in a narrow space thereof.

Because the light emitting unit can also be configured by integrating one or more light emitting diode elements, an LED lamp having an amount of light pursuant to a demanded effect of illumination can be manufactured.

The light emitting unit can obtain various light emitting colors by the characteristic of the light emitting diode elements for constituting the light emitting unit, while obtain emission of light of white color easily by mixing the YAG fluorescent material into the resin body for sealing light emitting diode elements.

If the light emitting diode elements constituting the light emitting unit are composed of three kind of red, green and blue colors, the emission of light of white color can be obtained by mixing light emitting colors or brightness of the light emitting diode elements.

As described above, by the reflecting surface of the reflecting frame being mirror-processed or plating-processed, the reflected efficiency is increased and a high illumination effect is acquired.

If the circuit substrate and the reflecting frame are formed by the MID which is capable of integrating the circuit substrate and the reflecting frame, the circuit substrate and the reflecting surface form the seamless continuous surface and therefore, a good reflected effect is obtained and mass-production of the LED lamp of the same quality can be achieved.

According to the LED lamp of the present invention, a sufficient amount of light can be obtained for the flash light source of the camera without increasing the number of the LED elements and current consumption by providing the reflecting frame having the concave portion for reflecting disposed to surround the periphery of the light emitting unit which is composed of the LED elements, on the circuit substrate.

Because the reflecting frame having the reflecting surface is also formed into approximately the same size as that of the circuit substrate in the top plan, the LED lamp can be installed in a small and thinned mobile phone, mobile terminal device or the like in which there is no large space for mounting the LED lamp.

More increased brightness and suitable directivity can be achieved by providing the lens body on reflecting frame and illumination effect suitable to use conditions or mounted instrument by selecting a shape or size of the lens body.

Moreover, light passes through the air layer and the lens body until it is radiated in the outside by providing the lens body on the reflecting frame and forming a space in the concave portion into the air layer and therefore refraction effect of light becomes large to enable the LED lamp to emit light more brightly by passing light through adjacent mediums of different refractive indexes.

Although the several embodiments of the present invention have been described, the present invention is not limited to these embodiments, and it will readily be appreciated by those skilled in the art that many modifications and changes can be made to the embodiments as described above, without departing from the scope of the present invention.

What is claimed is:

1. An LED lamp comprising:
a circuit substrate provided with an electrode pattern;
a light emitting unit mounted on said circuit substrate;
a reflecting frame mounted on said circuit substrate and including a concave portion disposed to surround said light emitting unit;
a lens body disposed above the light emitting unit and attached to said reflecting frame to seal the concave portion of the reflecting frame;
one air hole provided in at least one of the circuit substrate, the reflecting frame and the lens body for communication between the sealed concave portion of the reflecting frame and an outside of the lamp; and
a reflecting surface formed on an inner peripheral surface of the concave portion of the reflecting frame,
said reflecting surface including a taper shape configured to broaden toward an upper end of the reflecting frame.

2. The LED lamp according to claim 1, wherein said light emitting unit includes a plurality of light emitting diode elements and a transparent or translucent resin material to seal said light emitting diode elements.

3. The LED lamp according to claim 2, wherein the plurality of light emitting diode elements comprise a semiconductor of a gallium nitride system compound.

4. The LED lamp according to claim 2, wherein the plurality of light emitting diode elements are spaced equally peripherally of a central portion of the reflecting surface.

5. The LED lamp according to claim 1, wherein said lens body has a light incident surface and a light exit surface, and at least one of the light incident and exit surfaces comprises a convex surface or fresnel surface.

6. The LED lamp according to claim 1,
wherein said lens body has a light incident surface and a light exit surface,
wherein the light incident surface comprising a convex surface or fresnel surface is disposed to face the light emitting unit, and the exit surface is composed of a planar surface.

7. The LED lamp according to claim 6,
wherein said convex surface or fresnel surface formed on the light incident surface of the lens body is disposed to face the light emitting unit inside the concave portion of the reflecting frame,
wherein an outer edge of the planar surface formed on the light exit surface of the lens body is substantially flush with an outer side of an upper end of the reflecting frame.

8. The LED lamp according to claim 1, wherein said light emitting unit includes a blue light emitting diode element, a resin body to seal the blue light emitting diode element and a fluorescent material of yttrium, aluminum, garnet (YAG), mixed in the resin material, in order to obtain a light emitting color of white.

9. The LED lamp according to claim 1, wherein said light emitting unit includes a three kinds of light emitting diode elements comprising red, green and blue colors and a resin body to seal the light emitting diode elements.

10. The LED lamp according to claim 1, wherein a mirror surface or plating surface is provided on said inner peripheral surface of the concave portion.

11. The LED lamp according to claim 1, wherein said circuit substrate and the reflecting frame are formed by a molded interconnect device to form a circuit and an electrode on a three-dimensional resin molding.

12. The LED lamp according to claim 1,
wherein said lens body has a light incident surface and a light exit surface,
wherein the light incident surface comprising a planar surface is disposed to face the light emitting unit, and the exit surface comprises a convex surface.

* * * * *

UNITED STATES PATENT AND TRADEMARK OFFICE
CERTIFICATE OF CORRECTION

| | |
|---|---|
| PATENT NO. | : 7,066,626 B2 |
| APPLICATION NO. | : 10/820109 |
| DATED | : June 27, 2006 |
| INVENTOR(S) | : Kazuki Omata |

Page 1 of 1

It is certified that error appears in the above-identified patent and that said Letters Patent is hereby corrected as shown below:

Column 10, line 2, delete the term "a".

Signed and Sealed this

Sixth Day of February, 2007

JON W. DUDAS
*Director of the United States Patent and Trademark Office*